(12) United States Patent
Lepage et al.

(10) Patent No.: US 9,574,633 B2
(45) Date of Patent: Feb. 21, 2017

(54) METHOD FOR MONITORING A BLOCKING MEMBER, AND ELECTROMECHANICAL ACTUATOR

(71) Applicant: MESSIER-BUGATTI-DOWTY, Velizy-Villacoublay (FR)

(72) Inventors: Thomas Lepage, Velizy-Villacoublay (FR); Philippe Chico, Velizy-Villacoublay (FR); Francois Bonigen, Velizy-Villacoublay (FR); Frederic Ragot, Velizy-Villacoublay (FR)

(73) Assignee: MESSIER-BUGATTI-DOWTY, Velizy Villacoublay (FR)

( * ) Notice: Subject to any disclaimer, the term of this patent is extended or adjusted under 35 U.S.C. 154(b) by 108 days.

(21) Appl. No.: 14/591,084

(22) Filed: Jan. 7, 2015

(65) Prior Publication Data

US 2015/0198209 A1    Jul. 16, 2015

(30) Foreign Application Priority Data

Jan. 10, 2014 (FR) ..................... 14 50180

(51) Int. Cl.
  *F16D 66/00* (2006.01)
  *B64C 25/44* (2006.01)
  (Continued)

(52) U.S. Cl.
  CPC ............. *F16D 66/00* (2013.01); *B60T 13/741* (2013.01); *B60T 17/221* (2013.01); *B64C 25/44* (2013.01);
  (Continued)

(58) Field of Classification Search
  CPC .......... F16D 66/00; F16D 65/18; F16D 55/38; F16D 2066/005; F16D 2066/006; F16D 2121/24; B64C 25/44; B60T 17/221; B60T 13/741; B60T 17/22; G01R 31/343; G01K 13/00
  (Continued)

(56) References Cited

U.S. PATENT DOCUMENTS 6,471,017 B1 * 10/2002 Booz ................. F16D 55/02
                                                       188/162
6,915,883 B2 * 7/2005 Watanabe ............... B60T 1/005
                                                       188/156
(Continued)

FOREIGN PATENT DOCUMENTS

WO    2009/024168 A1    2/2009

OTHER PUBLICATIONS

French Preliminary Search Report for FR 1450180 dated Aug. 26, 2014.

*Primary Examiner* — Thomas J Williams
*Assistant Examiner* — Mariano Sy
(74) *Attorney, Agent, or Firm* — Sughrue Mion, PLLC

(57) ABSTRACT

A method for monitoring a blocking member (12) of an electromechanical actuator (1). The monitoring method comprising the steps of: determining a value representative of a power supply current of a motor (11) during an off-load operating phase of the electromechanical actuator (1); comparing the value representative of the power supply current with a predetermined current threshold defined from nominal off-load operating characteristics of the electromechanical actuator (1); and detecting an accidental locking of the blocking member (12) when the value representative of the power supply current is above or equal to the predetermined current threshold. There also is an electromechanical actuator (1) comprising a blocking member (12) monitored by such a method.

16 Claims, 4 Drawing Sheets

(51) Int. Cl.
*F16D 65/18* (2006.01)
*B60T 17/22* (2006.01)
*G01K 13/00* (2006.01)
*G01R 31/34* (2006.01)
*B60T 13/74* (2006.01)
*F16D 55/38* (2006.01)

(52) U.S. Cl.
CPC ............... *F16D 55/38* (2013.01); *F16D 65/18* (2013.01); *G01K 13/00* (2013.01); *G01R 31/343* (2013.01); *F16D 2066/005* (2013.01)

(58) Field of Classification Search
USPC ........................................ 188/18 R, 158, 162
See application file for complete search history.

(56) References Cited

U.S. PATENT DOCUMENTS

| | | | |
|---|---|---|---|
| 6,959,791 B2 * | 11/2005 | Usui | F16D 65/18 188/158 |
| 7,213,891 B2 * | 5/2007 | Sibre | B60T 8/00 303/199 |
| 7,344,207 B2 * | 3/2008 | Sibre | B60T 8/1703 303/199 |
| 8,152,247 B2 * | 4/2012 | Colin | B60T 8/1703 188/156 |
| 8,688,341 B2 * | 4/2014 | Thibault | B60T 8/1703 701/3 |
| 2003/0042802 A1 * | 3/2003 | Pierre | F16D 55/02 310/36 |
| 2005/0258683 A1 | 11/2005 | Yamaguchi | |
| 2008/0264740 A1 * | 10/2008 | Usui | F16D 65/18 188/73.31 |
| 2011/0079471 A1 * | 4/2011 | Colin | B60T 8/00 188/106 P |
| 2013/0006447 A1 * | 1/2013 | Thibault | B60T 8/1703 701/3 |
| 2013/0341134 A1 * | 12/2013 | Chico | F16D 65/28 188/158 |
| 2015/0217748 A1 * | 8/2015 | Chico | B60T 17/221 701/3 |

* cited by examiner

METHOD FOR MONITORING A BLOCKING MEMBER, AND ELECTROMECHANICAL ACTUATOR

The invention relates to a method for monitoring a blocking member of an electromechanical actuator and an electromechanical actuator comprising a blocking member monitored by such a method.

BACKGROUND OF THE INVENTION

An electromechanical aircraft brake generally comprises at least one electromechanical actuator comprising an electric motor and a plunger activated by the electric motor to selectively apply a pressing force on friction elements of the brake, for example a stack of carbon discs.

To produce the park brake function, that is to say the immobilisation of the aircraft without the pilot having to continually press on the brake pedals, the electromechanical actuator is provided with a blocking member which makes it possible to selectively immobilise the plunger of the actuator in position. In practice, the blocking member is, for example, a power-off brake which is powered in normal mode to allow the free displacement of the plunger of the electromechanical actuator under the action of the electric motor, but the power supply of which is cut to block the plunger in position upon the switchover to park mode.

There are few means for knowing the real state of the blocking member of the electromechanical actuator, and therefore for detecting any malfunction of this blocking member, for example an accidental locking thereof. Furthermore, the implementation of the existing means results in a not-inconsiderable increase in the weight of the electromechanical actuator.

OBJECT OF THE INVENTION

The object of the invention is to monitor a blocking member of an electromechanical actuator without increasing the weight of this electromechanical actuator.

SUMMARY OF THE INVENTION

In order to realise this aim, a method for monitoring a blocking member of an electromechanical actuator is proposed, the blocking member being adapted to block in position an actuation member driven by an electric motor of the electromechanical actuator, the monitoring method comprising the steps of:
- determining a value representative of a power supply current of the electric motor during an off-load operating phase of the electromechanical actuator;
- comparing the value representative of the power supply current with a predetermined current threshold, said predetermined current threshold being defined from nominal off-load operating characteristics of the electromechanical actuator;
- detecting an accidental locking of the blocking member when the value representative of the power supply current is above the predetermined current threshold.

The monitoring of the blocking member of the electromechanical actuator is therefore done by analysing a value representative of the power supply current of the electric motor of the electromechanical actuator, said representative value being obtained for example via a measurement of said power supply current performed by a pre-existing current sensor. This monitoring is therefore performed without the need to increase the weight of the electromechanical actuator.

An electromechanical actuator is also proposed that comprises an actuation member, an electric motor adapted to drive the actuation member and a blocking member adapted to block in position the actuation member. According to the invention, the blocking member is monitored by the monitoring method described above.

BRIEF DESCRIPTION OF THE DRAWINGS

The invention will be better understood in light of the following description with reference to the figures of the attached drawings in which.

DETAILED DESCRIPTION OF THE INVENTION

Figure 1:
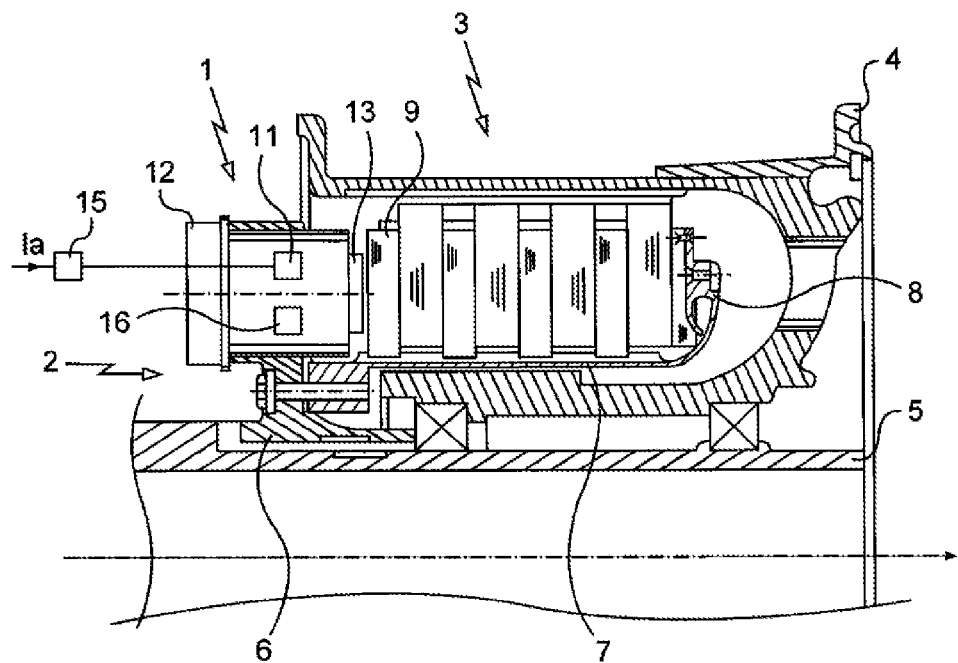
FIG. 1 is a cross-sectional view of a half-wheel of an aircraft provided with a brake comprising an electromechanical actuator of the invention.

Referring to FIG. 1, the monitoring method of the invention is used here to monitor a blocking member of a braking electromechanical actuator 1 of the invention with which a brake 2 of a brake-equipped aircraft wheel 3 is equipped.

The brake-equipped wheel 3 comprises a rim 4 adapted to receive a tyre (not represented here) and mounted to rotate on an axle 5 formed by a landing gear of the aircraft. The axle 5 has a crown ring 6 mounted on it, bearing at least one electromechanical actuator similar to the electromechanical actuator 1 of the invention. The crown ring 6 has a torque tube 7 fixed to it which extends in the rim 4 to end with a support 8. The crown ring 6, and therefore the torque tube 7, are stopped in rotation with regard to the axle 5 by stopping means which are not represented here.

Between the support 8 and the electromechanical actuator 1, there extend frictional elements of the brake 2 which here consist of a stack of discs 9 made up of rotors which are secured in rotation to the rim 4 and of stators which are secured in rotation to the torque tube 7.

The electromechanical actuator 1 comprises an actuation member, an electric motor 11 adapted to drive the actuation member and a blocking member 12 adapted to block in position the actuation member.

The actuation member here comprises a plunger 13 actuated by the electric motor 11 to selectively apply a controlled force onto the stack of discs 9. This controlled force produces friction forces between the rotors and the stators of the stack of discs 9 and contributes to slowing down the rotation of the rim 4 and therefore to the braking of the aircraft.

The blocking member 12 is, here, a power-off brake which, when powered, leaves the plunger 13 of the electromechanical actuator 1 free to be displaced under the action of the electric motor 11 but, when it is no longer powered, blocks the plunger 13 in position.

The electromechanical actuator 1 is thus used to apply at least two braking modes: a controlled braking mode and a park braking mode.

In the controlled braking mode, the plunger 13 of the electromechanical actuator 1 is displaced with respect to the stack of discs 9 by the electric motor 11. The electric motor 11 is powered by a power supply current Ia as a function of braking commands received from a braking computer which is not represented.

In the park braking mode, the plunger 13 is controlled to exert on the stack of discs 9 a park force and then is blocked in position by the blocking member 12.

The activation of each of these braking modes generates an approach movement of the plunger 13, during which the plunger 13 is displaced towards the stack of discs 9 without being in contact therewith. Similarly, the deactivation of each of these braking modes generates an away movement of the plunger 13, during which the plunger 13 moves away from the stack of discs 9 without being in contact therewith. During the approach movement of the plunger 13 and during the away movement of the plunger 13, the electromechanical actuator 1 applies no force onto the stack of discs 9.

Figure 2:
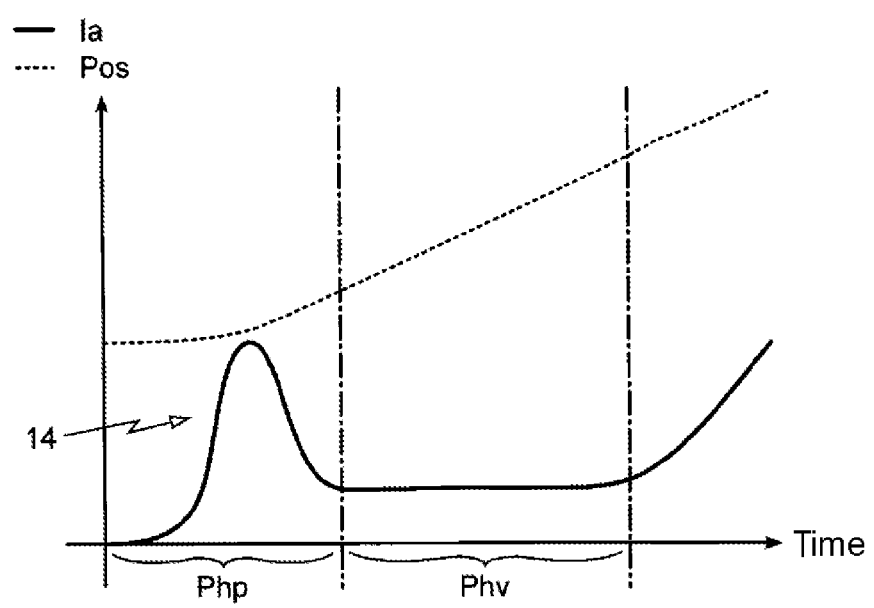
FIG. 2 is a graph illustrating the position of a plunger and a power supply current of an electric motor of the actuator in an approaching movement of the plunger towards a stack of brake discs, the actuator comprising a blocking member monitored by the monitoring method of the invention, the blocking member being normally unlocked.

The approach movement and the away movement of the plunger 13 can be broken down into two phases: a preliminary phase and an off-load operating phase. FIG. 2 illustrates the position Pos of the plunger 13 and the power supply current Ia of the electric motor 11 of the electromechanical actuator 1 during an approach movement of the plunger 13. By convention, it is considered that the power supply current Ia of the electric motor 11 is positive during the approach movement of the plunger 13.

During the preliminary phase Php, the power supply current Ia of the electric motor 11 takes the form of a current spike 14 corresponding to the driving of the inertia of the plunger 13. This preliminary phase Php corresponds to a phase of acceleration of the plunger 13. The position Pos of the plunger 13 varies significantly from this current spike 14.

During the off-load operating phase Phv, the power supply current Ia of the electric motor 11 is substantially constant. The speed of the plunger is stable, substantially constant, and the position Pos of the plunger 13 varies linearly.

The plunger 13 exhibits a similar behaviour when it performs an away movement, except that the power supply current Ia of the electric motor 11 is negative and the movement of the plunger 13 is performed in the opposite direction.

The monitoring method of the invention aims, when braking is controlled, to detect an accidental locking of the locking member 12, when the latter should normally be unlocked to allow a free displacement of the plunger 13 of the electromechanical actuator 1. The operating principle of the monitoring method lies in the fact that the power supply current Ia of the electric motor 11 of the electromechanical actuator 1 is abnormally high during an off-load operating phase Phv when the blocking member 12 is abnormally locked.

Figure 3:
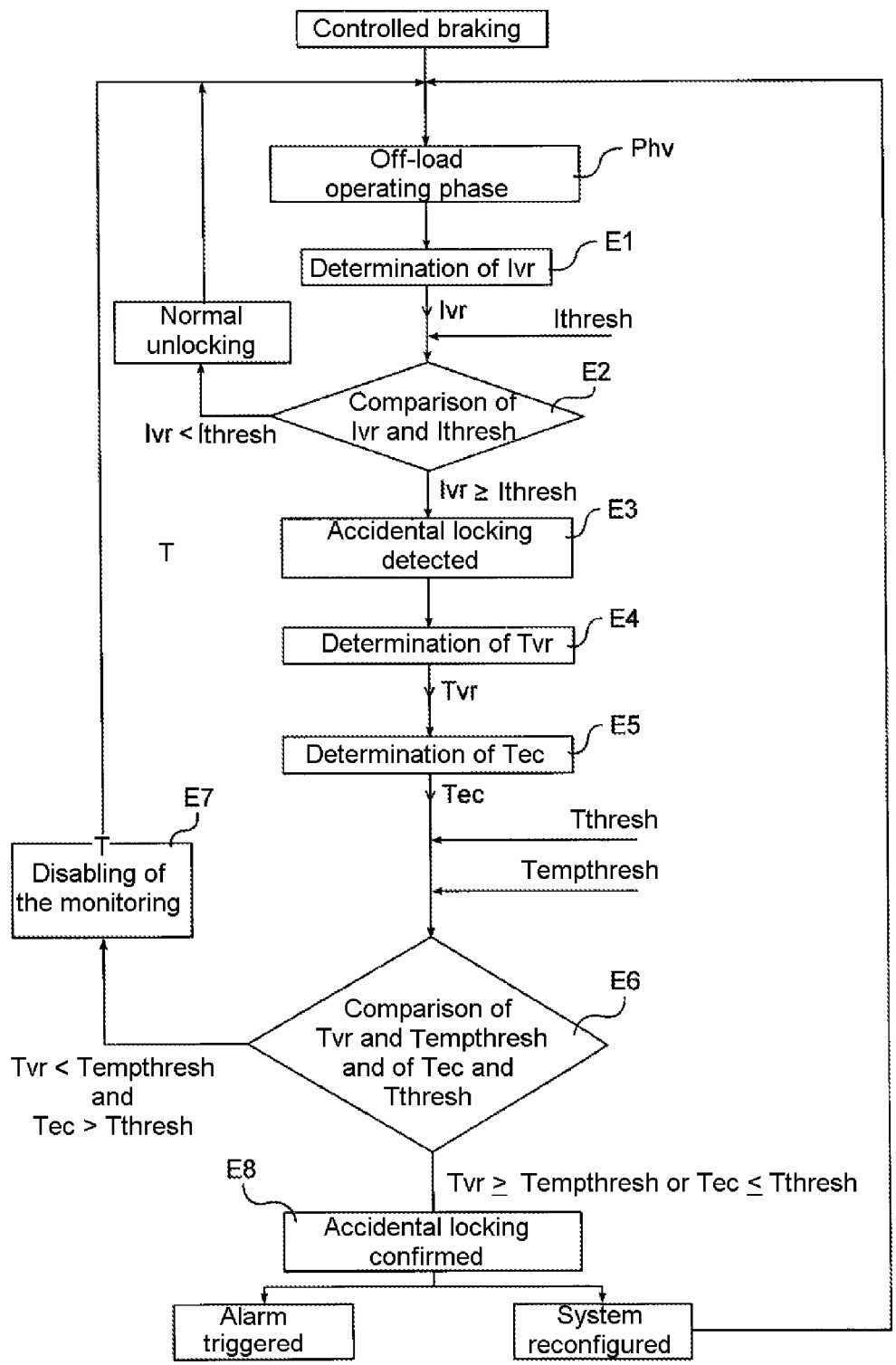
FIG. 3 is a functional diagram representing the monitoring method of the invention.

Referring to FIG. 3, the monitoring method of the invention comprises for this a step E1 during which a value Ivr representative of the power supply current Ia of the electric motor 11 is determined during an off-load operating phase Phv of the electromechanical actuator 1 during an approach movement of the plunger 13 or during an away movement of the plunger 13. Here, the value representative of the power supply current Ivr is an absolute value of an average of measured values of the power supply current Ia over a duration T. The power supply current Ia of the electric motor 11 is measured using a current sensor 15 (schematically represented in FIG. 1) here situated outside the electromechanical actuator 1. The use of an average of the power supply current makes it possible to at least partially eliminate any noise affecting the measurement of the current. The use of an absolute value of the current makes it possible to perform the measurement of the power supply current during an off-load operating phase Phv of an approach movement or of an away movement without modifying the monitoring method.

The monitoring method of the invention then comprises a step E2 during which the value representative of the power supply current Ivr is compared with a predetermined current threshold Ithresh. The predetermined current threshold Ithresh is defined from nominal off-load operating characteristics of the electromechanical actuator 1.

The monitoring method of the invention then comprises a step E3 during which an accidental locking of the blocking member 12 is detected when the value representative of the power supply current Ivr is above or equal to the predetermined current threshold Ithresh. If the value representative of the power supply current Ivr is strictly below the predetermined current threshold Ithresh, a normal unlocking of the blocking member is detected.

In the case where an accidental locking of the blocking member is detected, the monitoring method of the invention comprises confirmation steps for confirming the accidental locking.

The principle of these confirmation steps lies primarily in the fact that, when the ambient temperature in which the electromechanical actuator 1 operates is low, frictions internal to the electromechanical actuator 1 are significant, which can lead to a rise in the power supply current Ia of the electric motor 11 during the off-load operation of the electromechanical actuator 1. The principle of these confirmation steps then lies in the fact that, if an elapsed time Tec since a previous use of the electromechanical actuator 1 is relatively short, the electromechanical actuator 1 will not have had time to cool down and its operation will not therefore be disrupted by internal frictions.

The confirmation steps thus comprise a step E4 during which a value representative of a temperature Tvr of the electromechanical actuator 1 is determined, and a step E5 during which an elapsed time Tec since a previous use of the electromechanical actuator 1 is determined. The value representative of the temperature Tvr of the electromechanical actuator 1 is, here, a measurement of the internal temperature of the electromechanical actuator 1 performed by a temperature sensor 16 situated inside the electromechanical actuator 1.

The confirmation steps then comprise a step E6 during which the value representative of the temperature Tvr of the electromechanical actuator 1 is compared with a predetermined temperature threshold Tempthresh, and a step during which the elapsed time Tec is compared with a predetermined time threshold Tthresh.

The confirmation steps further comprise a step E7 which makes it possible to disable the monitoring of the blocking member 12 when the value representative of the temperature Tvr of the electromechanical actuator 1 is strictly below the predetermined temperature threshold Tempthresh and when the elapsed time Tec is strictly above the predetermined time threshold Tthresh, and the step E8 which makes it possible to confirm the accidental locking of the blocking member 12 when the value representative of the temperature Tvr of the electromechanical actuator 1 is above or equal to the predetermined temperature threshold Tempthresh or when the elapsed time Tec is below or equal to the predetermined temperature threshold Tempthresh.

When the accidental locking of the blocking member 12 is detected, an alarm is triggered to warn the pilot and/or to generate a failure message intended for any computer of a braking system incorporating the electromechanical actuator 1. A reconfiguration or a self-correction of the braking system can then be ordered, to try to correct the accidental locking of the blocking member 12 and to restore the electromechanical actuator 1 to normal operating conditions.

FIGS. 4 to 7, obtained by measurements performed on a genuine electromechanical actuator mounted on a genuine aircraft brake, make it possible to illustrate the principle of the monitoring method according to which the power supply current Ia of the electric motor 11 of the electromechanical actuator 1 is abnormally high during an off-load operating phase Phv when the blocking member 12 is abnormally locked.

Figure 4:
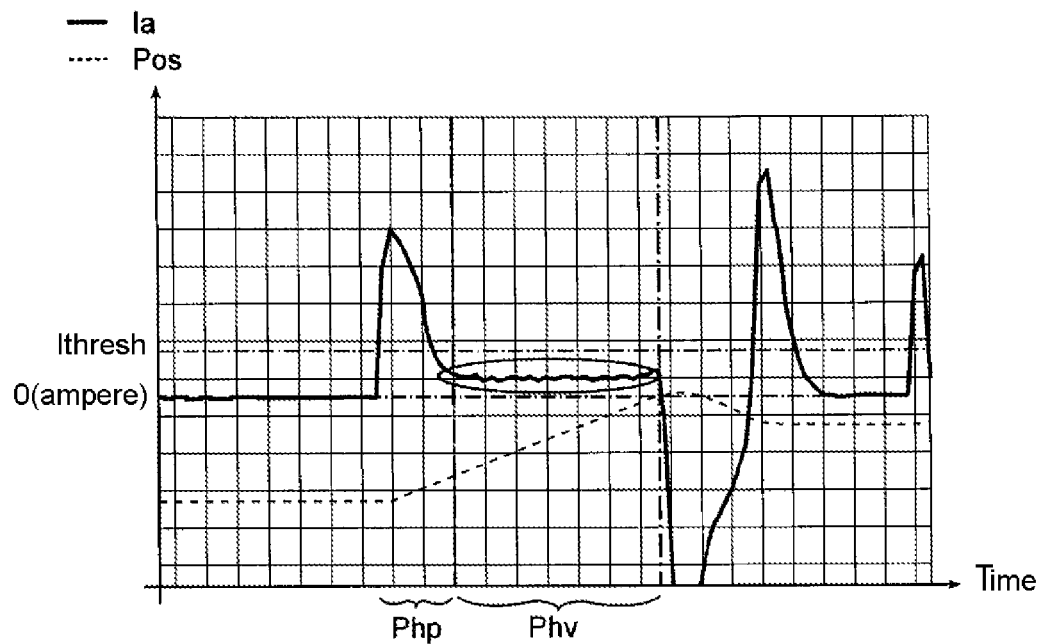
FIG. 4 is a graph similar to that of FIG. 2 obtained by real measurements performed on a genuine electromechanical actuator.

FIG. 4 illustrates the position of the plunger 13 and the power supply current Ia of the electric motor 11 of the electromechanical actuator 1 during an approach movement of the plunger 13 when the blocking member 12 is normally unlocked. It will be noted that the power supply current Ia is below the predetermined current threshold Ithresh during the off-load operating phase Phv of the electromechanical actuator 1.

Figure 5:
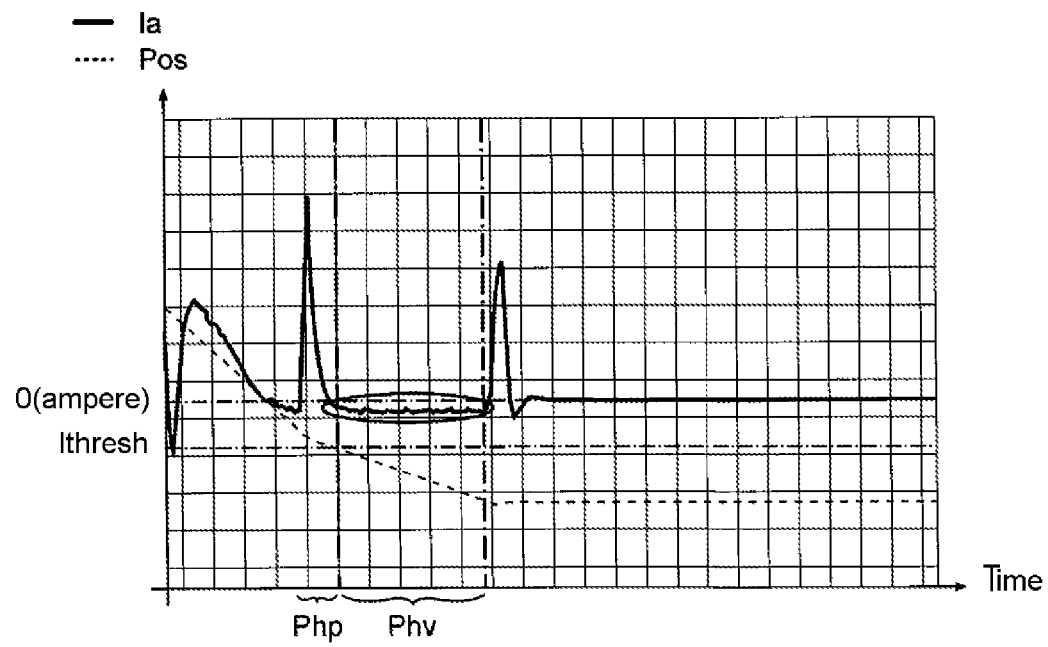
FIG. 5 is a graph similar to that of FIG. 2, this time illustrating a movement away from the plunger.

FIG. 5 illustrates the position of the plunger 13 and the power supply current Ia of the electric motor 11 of the electromechanical actuator 1 during an away movement of the plunger 13 when the blocking member 12 is normally unlocked. It will be noted that the power supply current Ia is below as an absolute value the predetermined current threshold Ithresh (here negative) during the off-load operating phase Phv of the electromechanical actuator 1.

Figure 6:
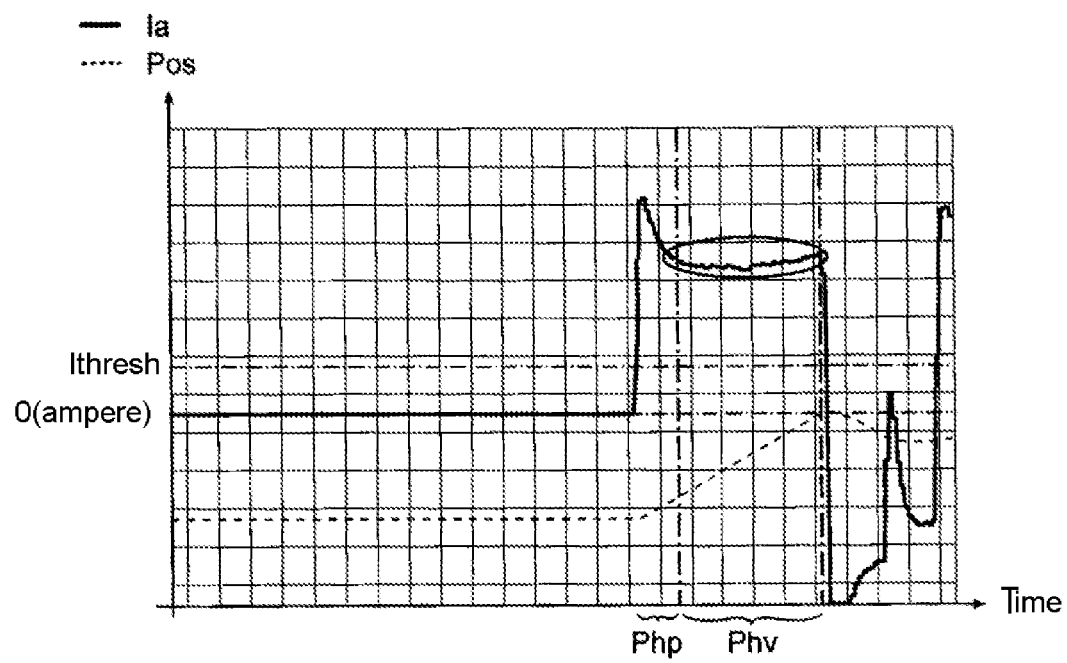
FIG. 6 is a graph similar to that of FIG. 4, this time illustrating an accidental locking of the blocking member.

FIG. 6 illustrates the position of the plunger 13 and the power supply current Ia of the electric motor 11 of the electromechanical actuator 1 during an approach movement of the plunger 13 when the blocking member 12 is abnormally locked. It will be noted that the power supply current Ia is significantly above the predetermined current threshold Ithresh during the off-load operating phase Phv of the electromechanical actuator 1.

Figure 7:
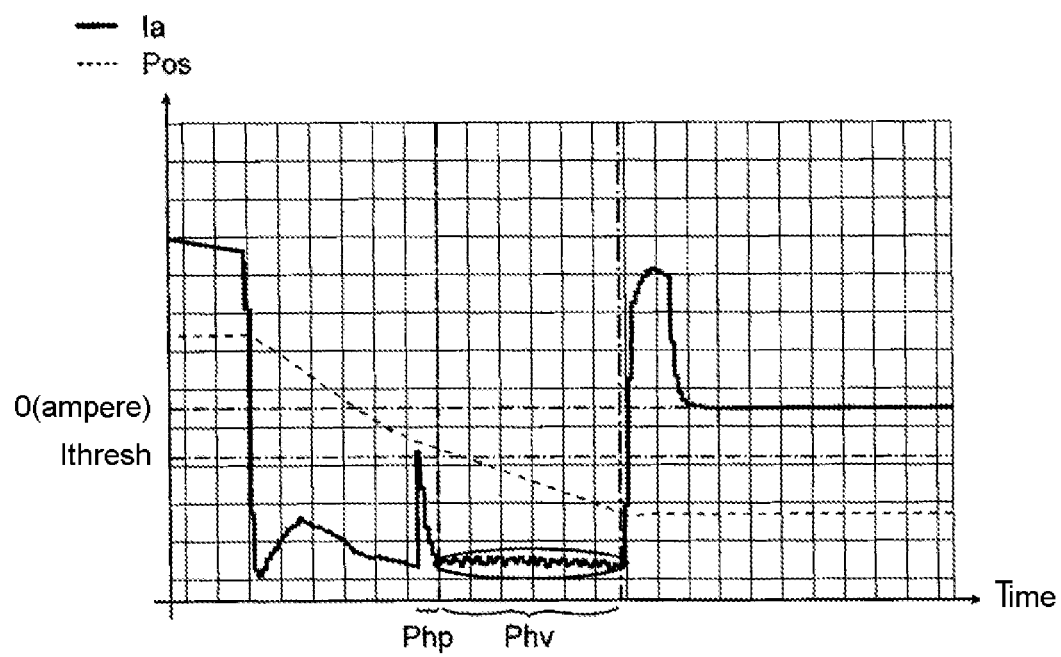
FIG. 7 is a graph similar to that of FIG. 5, this time illustrating an accidental locking of the blocking member.

FIG. 7 illustrates the position of the plunger 13 and the power supply current Ia of the electric motor 11 of the electromechanical actuator 1 during an away movement of the plunger 13 when the blocking member 12 is abnormally locked. It will be noted that the power supply current Ia is significantly above, as an absolute value, the predetermined current threshold Ithresh during the off-load operating phase of the electromechanical actuator 1.

The invention is not limited to the particular implementation which has just been described, but, on the contrary, covers any variant falling within the context of the invention as defined by the claims.

It is in particular possible to implement the monitoring method of the invention to monitor a blocking member of any electromechanical actuator provided with such a blocking member.

Although it has been stated that the value representative of the power supply current is an absolute value of an average of measured values of the power supply current, this value representative of the power supply current can be different: it is, for example, possible to directly use a measured value of the current, or else use another quantity representative of the power supply current (different electrical quantity, etc.). The current sensor can, of course, also be positioned directly in the electromechanical actuator.

Similarly, the value representative of the temperature of the electromechanical actuator can be obtained differently, for example via a brake temperature probe, or by the analysis of a parameter that does not require any temperature sensor (for example the resistance variation of a coil of the electric motor or else, when the blocking member is a power-off brake, of a winding of said power-off brake).

Note, also, that the off-load operating phase, during which the value representative of a power supply current of the electric motor is determined, can be an operating phase equally associated with park mode braking or controlled mode braking when the aircraft is rolling (landing, taxiing).

The invention claimed is:

1. A method for monitoring a blocking member (12) of an electromechanical actuator (1), the blocking member (12) being adapted to block in position an actuation member driven by an electric motor (11) of the electromechanical actuator (1), the monitoring method comprising the steps of:
   determining a value representative of a power supply current (Ivr) of the electric motor (11) during an off-load operating phase (Phv) of the electromechanical actuator (1);
   comparing the value representative of the power supply current with a predetermined current threshold (Ithresh), said predetermined current threshold being defined from nominal off-load operating characteristics of the electromechanical actuator (1); and
   detecting an accidental locking of the blocking member (12) when the value representative of the power supply current is above or equal to the predetermined current threshold.

2. The monitoring method according to claim 1, in which the value representative of the power supply current (Ivr) is an absolute value of an average (Ia) of measured values of the power supply current (Ivr).

3. The monitoring method according to claim 1, further comprising confirmation steps intended, when an accidental locking of the blocking member (12) is detected, to confirm said accidental locking, said confirmation steps comprising the steps of:
   determining a value representative of a temperature (Tvr) of the electromechanical actuator (1); and
   comparing the value representative of the temperature (Tvr) of the electromechanical actuator with a predetermined temperature threshold (Tempthresh).

4. The monitoring method according to claim 2, further comprising confirmation steps intended, when an accidental locking of the blocking member (12) is detected, to confirm said accidental locking, said confirmation steps comprising the steps of:
   determining a value representative of a temperature (Tvr) of the electromechanical actuator (1); and
   comparing the value representative of the temperature (Tvr) of the electromechanical actuator with a predetermined temperature threshold (Tempthresh).

5. The monitoring method according to claim 3, in which the confirmation steps further comprise the steps of:
   determining an elapsed time (Tec) since a previous use of the electromechanical actuator (1); and
   comparing the elapsed time (Tec) with a predetermined time threshold (Tthresh).

6. The monitoring method according to claim 4, in which the confirmation steps further comprise the steps of:
- determining an elapsed time (Tec) since a previous use of the electromechanical actuator (1); and
- comparing the elapsed time (Tec) with a predetermined time threshold (Tthresh).

7. The monitoring method according to claim 3, in which the confirmation steps further comprise the steps of:
- disabling a monitoring of the blocking member (12) when the value representative of the temperature (Tvr) of the electromechanical actuator (1) is strictly below the predetermined temperature threshold (Tempthresh) and when an elapsed time (Tec) is strictly above a predetermined time threshold (Tthresh); and
- confirming the accidental locking of the blocking member (12) when the value representative of the temperature (Tvr) of the electromechanical actuator (1) is above or equal to the predetermined temperature threshold (Tempthresh) or when the elapsed time (Tec) is below or equal to the predetermined time threshold (Tthresh).

8. The monitoring method according to claim 4, in which the confirmation steps further comprise the steps of:
- disabling a monitoring of the blocking member (12) when the value representative of the temperature (Tvr) of the electromechanical actuator (1) is strictly below the predetermined temperature threshold (Tempthresh) and when an elapsed time (Tec) is strictly above a predetermined time threshold (Tthresh); and
- confirming the accidental locking of the blocking member (12) when the value representative of the temperature (Tvr) of the electromechanical actuator (1) is above or equal to the predetermined temperature threshold (Tempthresh) or when the elapsed time (Tec) is below or equal to the predetermined time threshold (Tthresh).

9. The monitoring method according to claim 5, in which the confirmation steps further comprise the steps of:
- disabling a monitoring of the blocking member (12) when the value representative of the temperature (Tvr) of the electromechanical actuator (1) is strictly below the predetermined temperature threshold (Tempthresh) and when the elapsed time (Tec) is strictly above the predetermined time threshold (Tthresh); and
- confirming the accidental locking of the blocking member (12) when the value representative of the temperature (Tvr) of the electromechanical actuator (1) is above or equal to the predetermined temperature threshold (Tempthresh) or when the elapsed time (Tec) is below or equal to the predetermined time threshold (Tthresh).

10. The monitoring method according to claim 6, in which the confirmation steps further comprise the steps of:
- disabling a monitoring of the blocking member (12) when the value representative of the temperature (Tvr) of the electromechanical actuator (1) is strictly below the predetermined temperature threshold (Tempthresh) and when the elapsed time (Tec) is strictly above the predetermined time threshold (Tthresh); and
- confirming the accidental locking of the blocking member (12) when the value representative of the temperature (Tvr) of the electromechanical actuator (1) is above or equal to the predetermined temperature threshold (Tempthresh) or when the elapsed time (Tec) is below or equal to the predetermined time threshold (Tthresh).

11. The monitoring method according to claim 1, further comprising, when an accidental locking of the blocking member (12) is detected, a reconfiguration or self-correction step intended to try to unlock the blocking member (12).

12. The monitoring method according to claim 2, further comprising, when an accidental locking of the blocking member (12) is detected, a reconfiguration or self-correction step intended to try to unlock the blocking member (12).

13. An electromechanical actuator comprising an actuation member, an electric motor (11) adapted to drive the actuation member and a blocking member (12) adapted to blocking in position the actuation member, characterised in that the blocking member (12) is monitored by the monitoring method according to claim 1.

14. An electromechanical actuator comprising an actuation member, an electric motor (11) adapted to drive the actuation member and a blocking member (12) adapted to blocking in position the actuation member, characterised in that the blocking member (12) is monitored by the monitoring method according to claim 2.

15. The electromechanical actuator according to claim 13, the electromechanical actuator (1) being a braking actuator with which a brake (2) of an aircraft wheel (3) is equipped, the actuation member comprising a plunger (13) actuated by the electric motor (11) to selectively apply a controlled force to friction elements (9) of the brake (2).

16. The electromechanical actuator according to claim 14, the electromechanical actuator (1) being a braking actuator with which a brake (2) of an aircraft wheel (3) is equipped, the actuation member comprising a plunger (13) actuated by the electric motor (11) to selectively apply a controlled force to friction elements (9) of the brake (2).

* * * * *